United States Patent
Woo et al.

(10) Patent No.: US 9,105,510 B2
(45) Date of Patent: Aug. 11, 2015

(54) DOUBLE SIDEWALL IMAGE TRANSFER PROCESS

(71) Applicant: GLOBALFOUNDRIES Inc., Grand Cayman (KY)

(72) Inventors: Youngtag Woo, San Ramon, CA (US); Jongwook Kye, Pleasanton, CA (US); Dinesh Somasekhar, Portland, OR (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/461,745

(22) Filed: Aug. 18, 2014

(65) Prior Publication Data

US 2014/0353765 A1 Dec. 4, 2014

Related U.S. Application Data

(62) Division of application No. 13/709,541, filed on Dec. 10, 2012, now Pat. No. 8,889,561.

(51) Int. Cl.
  *H01L 21/8234* (2006.01)
  *H01L 27/11* (2006.01)
  *H01L 21/308* (2006.01)
  *H01L 27/088* (2006.01)
  *H01L 21/8238* (2006.01)

(52) U.S. Cl.
  CPC ........ *H01L 27/1108* (2013.01); *H01L 21/3086* (2013.01); *H01L 21/3088* (2013.01); *H01L 21/823431* (2013.01); *H01L 21/823821* (2013.01); *H01L 27/0886* (2013.01); *H01L 27/11* (2013.01)

(58) Field of Classification Search
  CPC ............ H01L 21/3086; H01L 21/3088; H01L 21/823431; H01L 21/823821; H01L 27/11; H01L 27/0889; H01L 27/1108; H01L 27/0886
  USPC .......................................................... 438/300
  See application file for complete search history.

(56) References Cited

U.S. PATENT DOCUMENTS

| | | | |
|---|---|---|---|
| 7,031,210 B2 * | 4/2006 | Park et al. ...................... 365/201 |
| 7,265,059 B2 * | 9/2007 | Rao et al. ....................... 438/734 |
| 7,390,746 B2 | 6/2008 | Bai et al. |
| 7,396,781 B2 | 7/2008 | Wells |
| 7,560,390 B2 | 7/2009 | Sant et al. |
| 7,611,980 B2 | 11/2009 | Wells et al. |
| 7,651,951 B2 | 1/2010 | Tran et al. |
| 7,687,339 B1 * | 3/2010 | Schultz et al. ................. 438/197 |
| 7,759,197 B2 | 7/2010 | Tran |
| 7,790,531 B2 | 9/2010 | Tran |
| 7,807,575 B2 | 10/2010 | Zhou |
| 7,829,466 B2 | 11/2010 | Johnson et al. |
| 7,829,951 B2 * | 11/2010 | Song et al. ..................... 257/365 |
| 7,852,661 B2 | 12/2010 | Liu |
| 7,884,022 B2 | 2/2011 | Bai et al. |
| 7,960,287 B2 * | 6/2011 | Johnson et al. ............... 438/703 |
| 7,994,020 B2 * | 8/2011 | Lin et al. ........................ 438/443 |

(Continued)

*Primary Examiner* — Mary Wilczewski
(74) *Attorney, Agent, or Firm* — Ditthavong & Steiner, P.C.

(57) ABSTRACT

Methodology enabling a generation of fins having a variable fin pitch less than 40 nm, and the resulting device are disclosed. Embodiments include: forming a hardmask on a substrate; providing first and second mandrels on the hardmask; providing a first spacer on each side of each of the first and second mandrels; removing the first and second mandrels; providing, after removal of the first and second mandrels, a second spacer on each side of each of the first spacers; and removing the first spacers.

17 Claims, 10 Drawing Sheets

(56) References Cited

U.S. PATENT DOCUMENTS

| | | | |
|---|---|---|---|
| 7,994,583 B2 * | 8/2011 | Inaba | 257/369 |
| 8,003,466 B2 * | 8/2011 | Shi et al. | 438/283 |
| 8,003,542 B2 | 8/2011 | Sant et al. | |
| 8,004,042 B2 | 8/2011 | Yang et al. | |
| 8,043,915 B2 | 10/2011 | Tran | |
| 8,099,686 B2 * | 1/2012 | Schultz | 716/55 |
| 8,110,506 B2 | 2/2012 | Min et al. | |
| 8,116,121 B2 * | 2/2012 | Kawasaki | 365/156 |
| 8,178,442 B2 | 5/2012 | Park et al. | |
| 8,315,084 B2 * | 11/2012 | Liaw et al. | 365/154 |
| 8,338,304 B2 | 12/2012 | Zhou | |
| 8,368,148 B2 * | 2/2013 | Inaba | 257/369 |
| 8,431,329 B2 | 4/2013 | Bae et al. | |
| 8,449,805 B2 | 5/2013 | Sandhu | |
| 8,450,833 B2 | 5/2013 | Kim | |
| 8,460,984 B2 * | 6/2013 | Wahl et al. | 438/164 |
| 8,492,215 B2 | 7/2013 | Yang et al. | |
| 8,513,131 B2 * | 8/2013 | Cai et al. | 438/696 |
| 8,519,481 B2 * | 8/2013 | Yuan et al. | 257/368 |
| 8,524,605 B1 | 9/2013 | Chen | |
| 8,525,267 B2 * | 9/2013 | Wang et al. | 257/365 |
| 8,569,168 B2 | 10/2013 | Holmes et al. | |
| 8,592,290 B1 * | 11/2013 | Basker et al. | 438/478 |
| 8,603,893 B1 * | 12/2013 | Wei et al. | 438/424 |
| 8,625,334 B2 * | 1/2014 | Liaw | 365/154 |
| 8,669,186 B2 * | 3/2014 | LiCausi | 438/696 |
| 8,697,515 B2 * | 4/2014 | Yin et al. | 438/239 |
| 8,722,494 B1 * | 5/2014 | Basker et al. | 438/283 |
| 8,723,271 B2 * | 5/2014 | Yuan et al. | 257/386 |
| 8,726,220 B2 * | 5/2014 | Lin et al. | 716/135 |
| 8,728,892 B2 * | 5/2014 | Ou et al. | 438/279 |
| 8,729,609 B2 * | 5/2014 | Johnson et al. | 257/264 |
| 8,753,940 B1 * | 6/2014 | Wei et al. | 438/283 |
| 8,779,528 B2 * | 7/2014 | Liaw | 257/393 |
| 8,809,963 B2 * | 8/2014 | Liaw | 257/390 |
| 8,815,659 B2 * | 8/2014 | Chi et al. | 438/157 |
| 8,822,320 B2 * | 9/2014 | Cheng et al. | 438/585 |
| 8,830,732 B2 * | 9/2014 | Liaw | 365/156 |
| 8,866,206 B2 * | 10/2014 | Sudo | 257/295 |
| 8,879,305 B2 * | 11/2014 | Liaw | 365/154 |
| 8,889,561 B2 * | 11/2014 | Woo et al. | 438/703 |
| 8,901,615 B2 * | 12/2014 | Moroz | 257/207 |
| 8,927,432 B2 * | 1/2015 | Guo et al. | 438/696 |
| 8,969,974 B2 * | 3/2015 | Liaw | 257/401 |
| 2007/0284669 A1 * | 12/2007 | Abadeer et al. | 257/368 |
| 2010/0015778 A1 * | 1/2010 | Lin et al. | 438/443 |
| 2010/0129968 A1 * | 5/2010 | Li et al. | 438/154 |
| 2010/0308409 A1 * | 12/2010 | Johnson et al. | 257/368 |
| 2011/0147848 A1 * | 6/2011 | Kuhn et al. | 257/368 |
| 2011/0195564 A1 * | 8/2011 | Liaw et al. | 438/585 |
| 2011/0222332 A1 | 9/2011 | Liaw et al. | |
| 2011/0269275 A1 | 11/2011 | Yang et al. | |
| 2011/0317485 A1 | 12/2011 | Liaw | |
| 2012/0175701 A1 * | 7/2012 | Park | 257/334 |
| 2013/0069167 A1 * | 3/2013 | Zhu et al. | 257/369 |
| 2013/0154027 A1 | 6/2013 | Liaw | |
| 2013/0181297 A1 * | 7/2013 | Liaw | 257/390 |
| 2013/0235652 A1 | 9/2013 | Liaw | |
| 2013/0244437 A1 | 9/2013 | Flachowsky et al. | |
| 2013/0280903 A1 | 10/2013 | Liaw et al. | |
| 2013/0285156 A1 | 10/2013 | Cai et al. | |
| 2014/0024209 A1 | 1/2014 | Jung et al. | |
| 2014/0077303 A1 * | 3/2014 | Baek | 257/365 |
| 2014/0097493 A1 * | 4/2014 | Baek et al. | 257/347 |
| 2014/0131813 A1 * | 5/2014 | Liaw | 257/401 |
| 2014/0131831 A1 * | 5/2014 | Wei et al. | 257/506 |
| 2014/0242797 A1 * | 8/2014 | Adam et al. | 438/692 |
| 2014/0284719 A1 * | 9/2014 | Khakifirooz et al. | 257/351 |
| 2014/0291766 A1 * | 10/2014 | Hafez et al. | 257/365 |
| 2014/0291770 A1 * | 10/2014 | Yin et al. | 257/397 |
| 2014/0353765 A1 * | 12/2014 | Woo et al. | 257/391 |
| 2014/0374829 A1 * | 12/2014 | Sudo | 257/347 |
| 2015/0041812 A1 * | 2/2015 | Cheng et al. | 257/57 |
| 2015/0041958 A1 * | 2/2015 | Cheng et al. | 257/618 |
| 2015/0076617 A1 * | 3/2015 | Kim et al. | 257/392 |

\* cited by examiner

DOUBLE SIDEWALL IMAGE TRANSFER PROCESS

CROSS REFERENCE TO RELATED APPLICATION

This application is a Divisional of U.S. application Ser. No. 13/709,541 filed Dec. 10, 2012, the content of which is incorporated herein by reference in its entirety.

TECHNICAL FIELD

1. Technical Field

The present disclosure relates to manufacture of semiconductor devices with fins. The present disclosure is particularly applicable to generating fins for a static random access memory (SRAM) bitcell for the 10 nanometer (nm) technology node and beyond.

2. Background

In fabrication of semiconductor devices, particularly fabrication of SRAM bitcells, traditional methods utilize fins generated using a single sidewall image transfer (SIT) process. However, traditional single SIT methods may only generate fins having a fin pitch greater than 40 nm. Further, traditional SIT methods generate a constant fin pitch, resulting in an inefficient use of layout area.

A need therefore exists for methodology enabling a generation of fins having a variable fin pitch less than 40 nm, and the resulting device.

SUMMARY

An aspect of the present disclosure is a method of generating fins on a substrate by, inter alia, utilizing a first spacer on each side of a mandrel as a mandrel for a second spacer.

Another aspect of the present disclosure is a device having, inter alia, a first and second fin being separated by a first distance and a third fin being separated from the second fin by a second distance, different from the first distance.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a hardmask on a substrate; providing first and second mandrels on the hardmask; providing a first spacer on each side of each of the first and second mandrels; removing the first and second mandrels; providing, after removal of the first and second mandrels, a second spacer on each side of each of the first spacers; and removing the first spacers.

Aspects include a method, wherein the first and second mandrels have first and second widths, respectively, the method further including providing the second mandrel on the hardmask at a distance from the first mandrel, the distance exceeding the first width, second width, or each of the first and second widths. Further aspects include a method, wherein the first spacers each have a third width being less than the distance, first width, second width, or a combination thereof. Additional aspects include etching, after removal of the first spacers, the hardmask using the second spacers as a mask. Some aspects include etching, after etching of the hardmask, a part of a layer of the substrate using the hardmask as a mask, a remaining part of the layer being first, second, third, fourth, fifth, sixth, seventh, and eighth fins, the second fin being between the first and third fin, the third fin being between the second and fourth fins, the fourth fin being between the third and fifth fins, the fifth fin being between the fourth and sixth fins, the sixth fin being between the fifth and seventh fins, and the seventh fin being between the sixth and eighth fins; and removing the hardmask and the second spacers. Further aspects include: forming, in the substrate, a first pull-down (PD) transistor, wherein the first fin is formed on the first PD transistor; forming, in the substrate, a first passgate (PG) transistor, wherein the first fin is formed on the first PG transistor; forming, in the substrate, a first pull-up (PU) transistor, wherein the second fin is formed on the first PU transistor; forming, in the substrate, a second PU transistor, wherein the third fin is formed on the second PU transistor; forming, in the substrate, a second PG transistor, wherein the fourth fin is formed on the second PG transistor; and forming, in the substrate, a second PD transistor, wherein the fourth fin is formed on the second PD transistor. Additional aspects include: forming, in the substrate, a first PD transistor, wherein the first and second fins are formed on the first PD transistor; forming, in the substrate, a first PG transistor, wherein the first and second fins are formed on the first PG transistor; forming, in the substrate, a first PU transistor, wherein the third fin is formed on the first PU transistor; forming, in the substrate, a second PU transistor, wherein the sixth fin is formed on the second PU transistor; forming, in the substrate, a second PG transistor, wherein the seventh and eighth fins are formed on the second PG transistor; and forming, in the substrate, a second PD transistor, wherein the seventh and eighth fins are formed on the second PD transistor. Some aspects include a method, wherein the fourth fin is formed on the first PU transistor and the fifth fin is formed on the second PU transistor.

Another aspect of the present disclosure is a device having: a substrate; a first fin in the substrate; a second fin in the substrate being separated from the first fin by a first distance; a third fin in the substrate being separated from the second fin by a second distance, and being separated from the first fin by the second fin, wherein the first and second distances are different; and a fourth fin in the substrate separated from the third fin by the first distance, the fourth fin being separated from the second fin by the third fin.

Aspects include a device, wherein the first distance is less than the second distance. Additional aspects include a device having: a fifth fin in the substrate separated from the fourth fin by a third distance, the fifth fin being separated from the third fin by the fourth fin; a sixth fin in the substrate separated from the fifth fin by the first distance, the sixth fin being separated from the fourth fin by the fifth fin; a seventh fin in the substrate separated from the sixth fin by the second distance, the seventh fin being separated from the fifth fin by the sixth fin; and an eighth fin in the substrate separated from the seventh fin by the first distance, and the eighth fin being separated from the sixth fin by the seventh fin. Further aspects include a device, wherein the first, second, and third distances are different. Some aspects include a device having: a first PD transistor, in the substrate, wherein the first fin is formed on the first PD transistor; a first PG transistor, in the substrate, wherein the first fin is formed on the first PG transistor; a first PU transistor, in the substrate, wherein the second fin is formed on the first PU transistor; a second PU transistor, in the substrate, wherein the third fin is formed on the second PU transistor; a second PG transistor, in the substrate, wherein the fourth fin is formed on the second PG transistor; and a second PD transistor, in the substrate, wherein the fourth fin is formed on the second PD transistor. Additional aspects include a device having: a first PD transistor, in the substrate, wherein the first, second, and third fins are formed on the first PD transistor; a first PG transistor, in the substrate, wherein the first and second fins are formed on the first PG transistor; a first PU transistor, in the substrate, wherein the fourth fin is formed on the first PU transistor; a second PU transistor, in the substrate, wherein the fifth fin is formed on the second PU transistor; a second PG transistor, in the substrate, wherein the seventh and eighth fins are formed on the second PG transistor; and a second PD transistor, in the substrate, wherein the sixth, seventh, and eighth fins are formed on the second PD transistor. Some aspects include a device having: a first PD transistor, in the substrate, wherein the first and second fins are formed on the first PD transistor; a first PG transistor, in the substrate, wherein the first and second fins are formed on the first PG transistor; a first PU transistor, in the substrate, wherein the third fin is formed on the first PU transistor; a second PU transistor, in the substrate, wherein the sixth fin is formed on the second PU transistor; a second PG transistor, in the substrate, wherein the seventh and eighth fins are formed on the second PG transistor; and a second PD transistor, in the substrate, wherein the seventh and eighth fins are formed on the second PD transistor. Further aspects include a device, wherein the fourth fin is formed on the first PU transistor and the fifth fin is formed on the second PU transistor.

Another aspect of the present disclosure is a method including: forming a hardmask on a substrate; providing a first mandrel having a first width on the hardmask; providing a second mandrel having a second width, different from the first width, on the hardmask at a first distance from the first mandrel, the first distance exceeding the first width; providing a first spacer on each side of each of the first and second mandrels, each of the first spacers having a third width being less than the first and second widths; removing the first and second mandrels; providing, after removal of the first and second mandrels, a second spacer on each side of each of the first spacers, each of the second spacers having a fourth width being less the third width; removing the first spacers; etching, after removal of the first spacers, the hardmask using the second spacers as a mask; etching, after etching of the hardmask, a part of a layer of the substrate using the hardmask as a mask, a remaining part of the layer being first, second, third, fourth, fifth, sixth, seventh, and eighth fins, the second fin being between the first and third fin, the third fin being between the second and fourth fins, the fourth fin being between the third and fifth fins, the fifth fin being between the fourth and sixth fins, the sixth fin being between the fifth and seventh fins, and the seventh fin being between the sixth and eighth fins; and removing the hardmask and the second spacers.

Some aspects include: forming, in the substrate, a first PD transistor, wherein the first fin is formed on the first PD transistor; forming, in the substrate, a first PG transistor, wherein the first fin is formed on the first PG transistor; forming, in the substrate, a first PU transistor, wherein the second fin is formed on the first PU transistor; forming, in the substrate, a second PU transistor, wherein the third fin is formed on the second PU transistor; forming, in the substrate, a second PG transistor, wherein the fourth fin is formed on the second PG transistor; and forming, in the substrate, a second PD transistor, wherein the fourth fin is formed on the second PD transistor. Further aspects include: forming, in the substrate, a first PD transistor, wherein the first and second fins are formed on the first PD transistor; forming, in the substrate, a first PG transistor, wherein the first and second fins are formed on the first PG transistor; forming, in the substrate, a first PU transistor, wherein the third fin is formed on the first PU transistor; forming, in the substrate, a second PU transistor, wherein the sixth fin is formed on the second PU transistor; forming, in the substrate, a second PG transistor, wherein the seventh and eighth fins are formed on the second PG transistor; and forming, in the substrate, a second PD transistor, wherein the seventh and eighth fins are formed on the second PD transistor. Additional aspects include a method, wherein the fourth fin is formed on the first PU transistor and the fifth fin is formed on the second PU transistor.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of an inability to form fins on a substrate having a fin pitch less than 40 nm and/or having a variable pitch attendant upon forming semiconductor devices, particularly SRAM bitcells, using a conventional SIT process. In accordance with embodiments of the present disclosure, the problems are solved, for instance by, inter alia, utilizing a first spacer on each side of a mandrel as a mandrel for a second spacer. Further, aspects of the present disclosure enable a variable fin pitch by, for instance, adjusting the mandrel widths and spacing and the first spacer widths.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
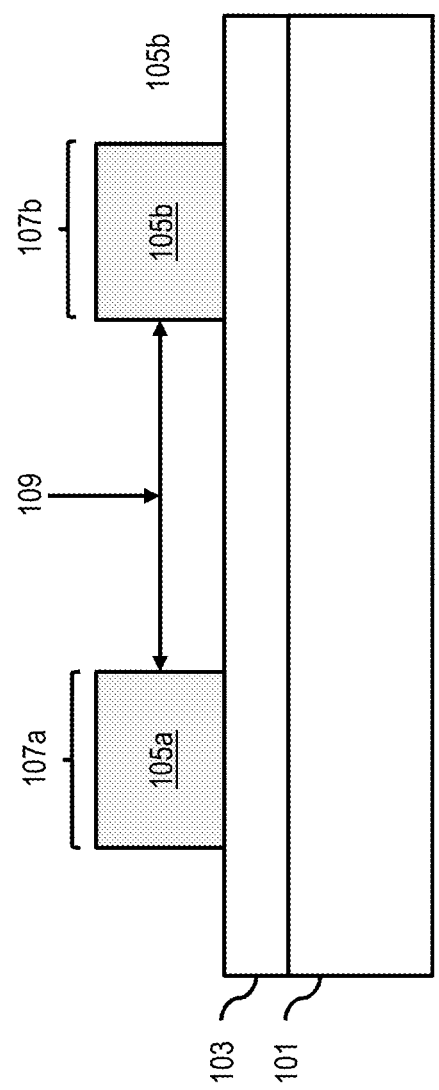
FIGS. 1 through 6 schematically illustrate a double SIT process for forming fins having variable pitch, in accordance with an exemplary embodiment.

Adverting to FIG. 1 in accordance with exemplary embodiments, a substrate 101, for example a bulk silicon substrate, is provided with a hardmask 103 having a first mandrel 105a and a second mandrel 105b. The mandrels 105a and 105b may be formed of amorphous silicon (a-Si) and have widths 107a and 107b, respectively, which may be identical or different. As shown, the mandrels 105a and 105b are separated by distance 109 from each other exceeding widths 107a and 107b of the mandrels 105a and 105b. The substrate 101, hardmask 103, and mandrels 105a and 105b may be formed using conventional front-end-of-line (FEOL) steps.

Figure 2:
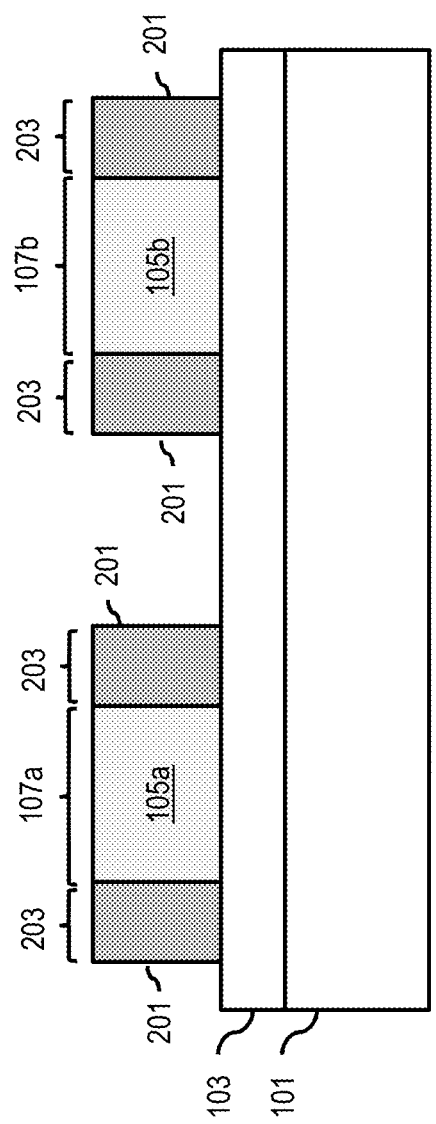

Adverting to FIG. 2, first spacers 201 having widths 203 are provided on sides of each of the mandrels 105a and 105b. The first spacers 201 may be a formed of nitride and have identical widths. As shown in FIG. 2, the first spacers 201 have widths 203 being less than widths 107a and 107b of the mandrels 105a and 105b, respectively.

Figure 3:
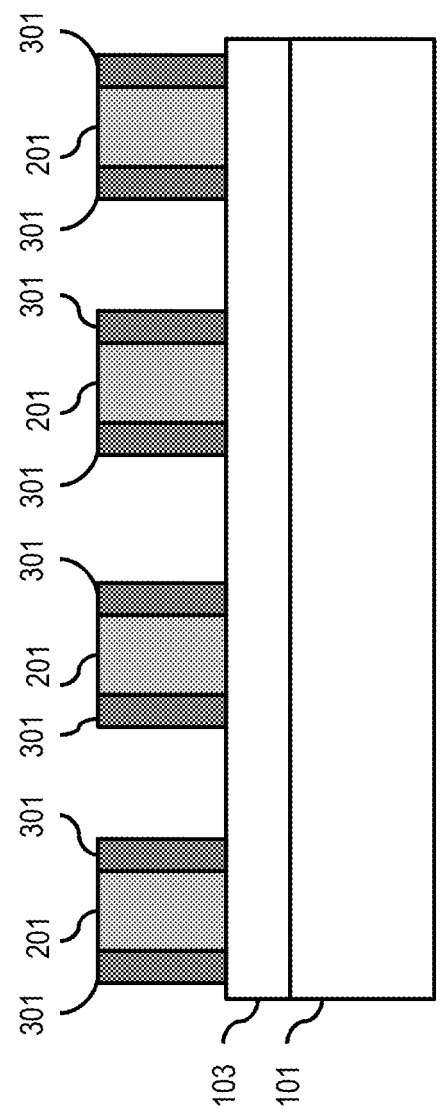
Figure 4:
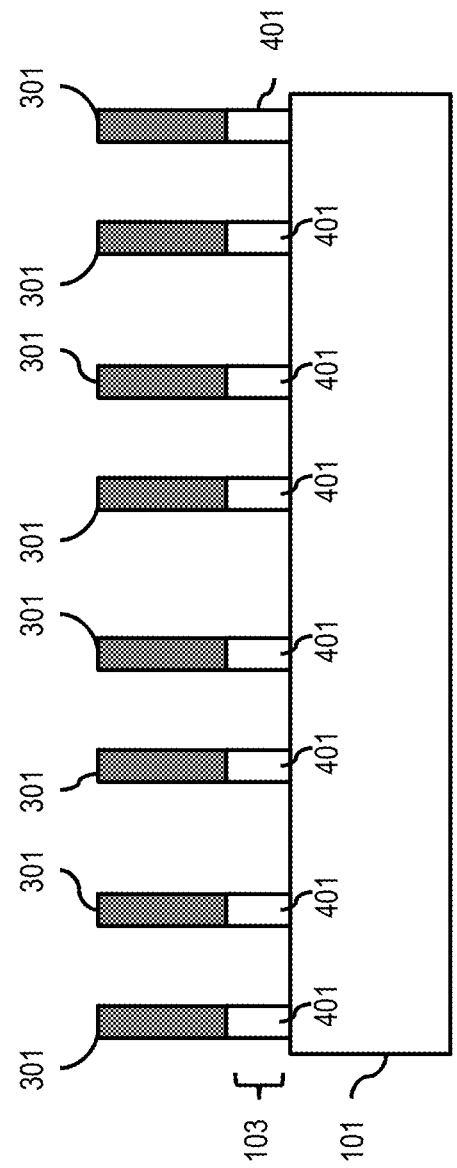
Figure 5:
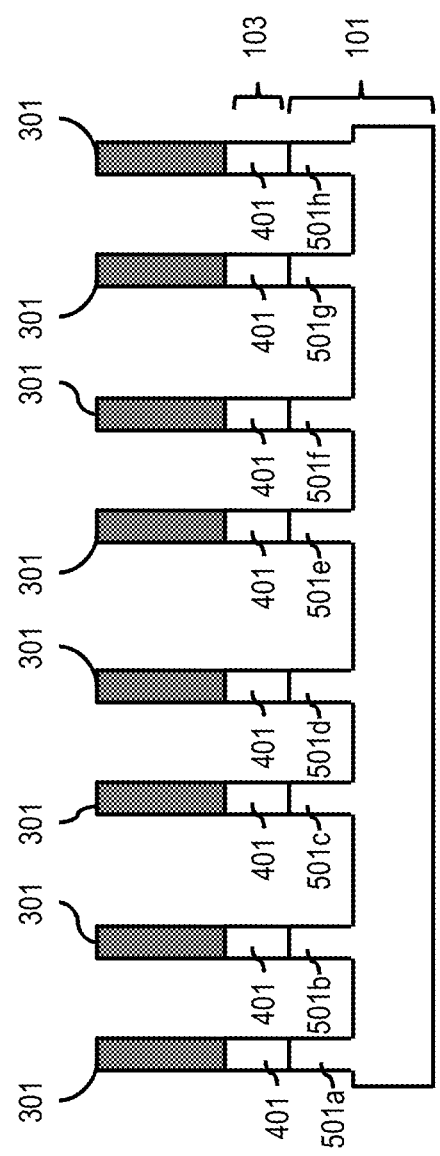

As illustrated in FIG. 3, the mandrels 105a and 105b are removed and second spacers 301 are provided on sides of each of the first spacers 201. Adverting to FIG. 4, the first spacers 201 are removed and portions 401 of the hardmask 103 remain after the hardmask 103 is etched using the second spacers 301 as a mask. Next, as illustrated in FIG. 5, fins 501a through 501h are formed after etching using the remaining portion 401 of the hardmask 103 as a mask. As shown, fins 501a through 501h include the second fin 501b being between the first fin 501a and third fin 501c, the third fin 501c being between the second fin 501b and fourth fin 501d, the fourth fin 501d being between the third fin 501c and fifth fin 501e, the fifth fin 501e being between the fourth fin 501d and sixth fin 501f, the sixth fin 501f being between the fifth fin 501e and seventh fin 501h, and the seventh fin 501g being between the sixth fin 501f and eighth fin 501h. Fins 501a through 501h have a uniform thickness, but may have variable spacing.

Figure 6:
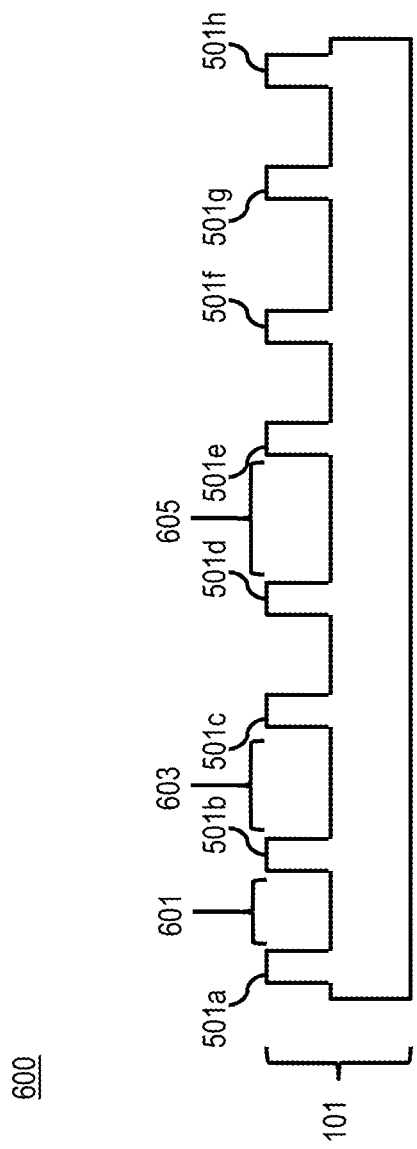

FIG. 6 illustrates a resulting device 600 with the second spacers 301 and the hardmask 103, including portions 401, removed. As illustrated, fins 501a and 501b are separated by a first distance 601, fins 501b and 501c are separated by a second distance 603, and fins 501d and 501e are separated by a third distance 605. As shown, the first distance 601, second distance 603, and third distance 605 are different. A coupled fin's inter-spaces (e.g., second and third distances 603 and 605) are based on a width of mandrel (e.g., 105a) and a space between mandrels (e.g., 109). For instance, as a width of mandrels (e.g., 107a and 107b) increases, an inter-space 603 of resulting fins increases, while inter-space 605 decreases. Therefore, space 605 may be the same as, greater than, or less than space 603.

FIGS. 7A, 7B, 7C, and 7D schematically illustrate fins having variable pitch of less than 40 nm (e.g., 20 nm) on exemplary SRAM bitcells, in accordance with exemplary embodiments. FIGS. 7A, 7B, 7C, and 7D include fins 701a through 701h, PD transistors 703a through 703d, PG transistors 705a through 705d, and PU transistors 707a through 707d. Fins 701a through 701h may be generated in multiples of four (e.g., 4, 8, 12, etc.).

Figure 7A:
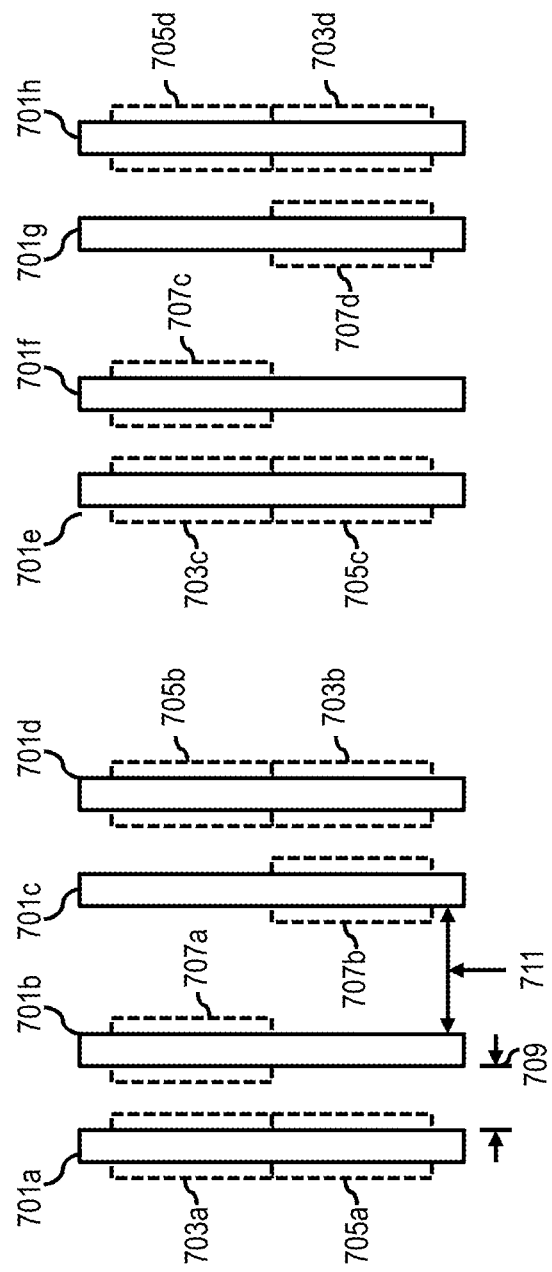
FIGS. 7A, 7B, 7C, and 7D schematically illustrate exemplary SRAM bitcells utilizing fins having a variable pitch of less than 40 nm, in accordance with exemplary embodiments.

FIG. 7A illustrates an exemplary 1-1-1 SRAM configuration having fin 701a formed on PD transistor 703a and PG transistor 705a, fin 701b formed on PU transistor 707a, fin 701c formed on PU transistor 707b, and fin 701d formed on PD transistor 703b and PG transistor 705b. Additional 1-1-1 SRAM bitcells may be formed on the same substrate (e.g., 101). For instance, FIG. 7A illustrates a second 1-1-1 SRAM having fin 701e formed on PD transistor 703c and PG transistor 705c, fin 701f formed on PU transistor 707c, fin 701g formed on PU transistor 707d, fin 701h formed on PD transistor 703d and PG transistor 705d. As noted before, generating fins (e.g., 501a through 501h, 701a through 701h) with a variable fin pitch enables efficient use of layout areas. For example, a device may require a first spacing 709 to allow for a particular layout (such as that illustrated in FIG. 7A) of PD transistors 703 and PU transistors 707, and a second spacing 711, larger than the first spacing 709, to allow for a specific layout of PU transistors 707. As such, the resulting device shown in FIG. 7A is configured to separate fins corresponding to PD transistors from fins corresponding to PU transistors by the first spacing 709, and separate fins corresponding to PU transistors from fins corresponding to other PU transistors by the second spacing 711. For instance, fin 701b being formed on PU transistor 707a may be separated by the first spacing 709 of 20 nm from fin 701a which is formed on PD transistor 703a. Similarly, fin 701b being formed on PU transistor 707a may be separated by the second spacing 711 of 30 nm from fin 701c which is formed on PU transistor 707b.

Figure 7B:
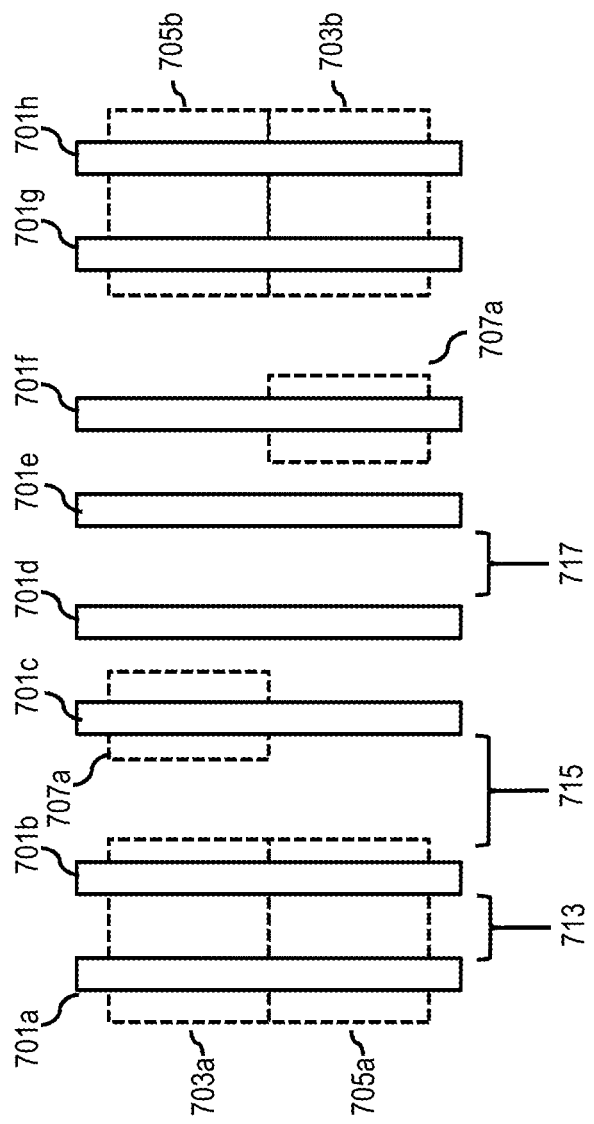

FIG. 7B illustrates an exemplary 1-2-2 SRAM configuration having fins 701a and 701b formed on PD transistor 703a and PG transistor 705a, fin 701c formed on PU transistor 707a, fin 701f formed on PU transistor 707b, and fins 701g and 701h formed on PD transistor 703b and PG transistor 705b. Additional 1-2-2 SRAM bitcells may be formed on the same substrate (not shown). As illustrated, the exemplary 1-2-2 SRAM has a first distance 713 of 30 nm, a second distance 715 of 44 nm and a third distance 717 of 24 nm. The exemplary 1-2-2 SRAM may be formed using the processes described with respect to FIGS. 1 through 6, for example, with a first mandrel (e.g., 105a) having a width (e.g., 107a) of 40 nm being separated by a distance (e.g., 109) of 120 nm from a second mandrel (e.g., 105b) having a width (e.g., 107b) of 90 nm, a first spacer (e.g., 201) having a width (e.g., 203) of 30 nm, and a second spacer (e.g., 301) having a width of 8 nm.

Figure 7C:
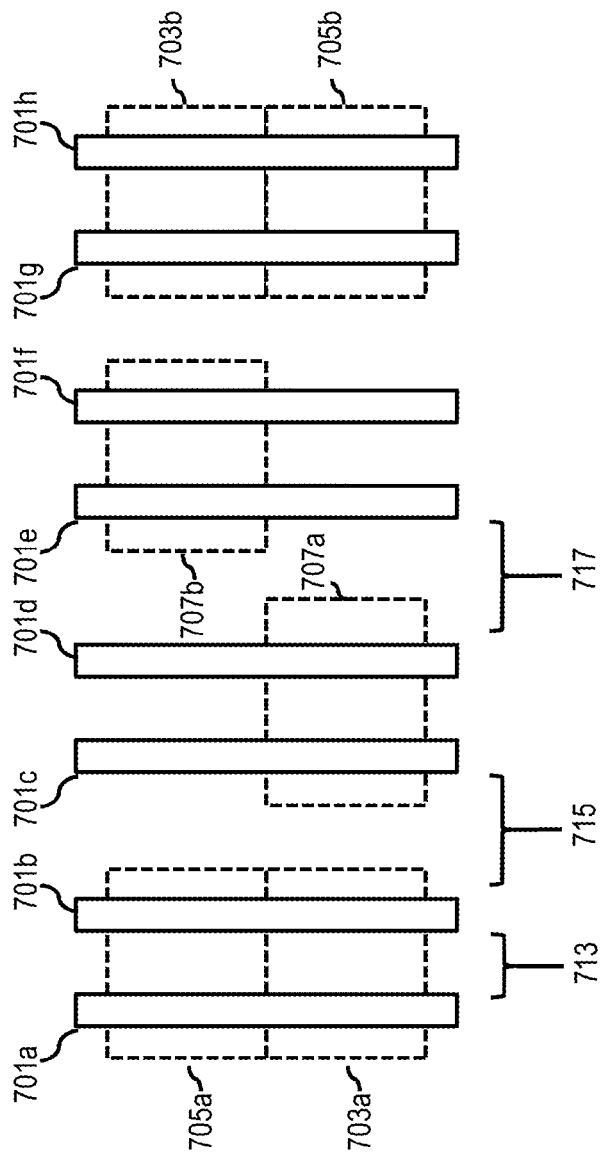

FIG. 7C illustrates an exemplary 2-2-2 SRAM configuration having fins 701a and 701b formed on PD transistor 703a and PG transistor 705a, fins 701c and 701d formed on PU transistor 707a, fins 701e and 701f formed on PU transistor 707b, and fins 701g and 701h formed on PD transistor 703b and PG transistor 705b. Additional 2-2-2 SRAM bitcells may be formed on the same substrate (not shown). As illustrated, the exemplary 2-2-2 SRAM has a first distance 713 of 20 nm, a second distance 715 of 44 nm and a third distance 717 of 44 nm. The exemplary 2-2-2 SRAM may be formed using the processes described with respect to FIGS. 1 through 6, for example, with a first mandrel (e.g., 105a) having a width (e.g., 107a) of 60 nm being separated by a distance (e.g., 109) of 100 nm from a second mandrel (e.g., 105b) having a width (e.g., 107b) of 90 nm, a first spacer (e.g., 201) having a width (e.g., 203) of 20 nm, and a second spacer (e.g., 301) having a width of 8 nm.

Figure 7D:
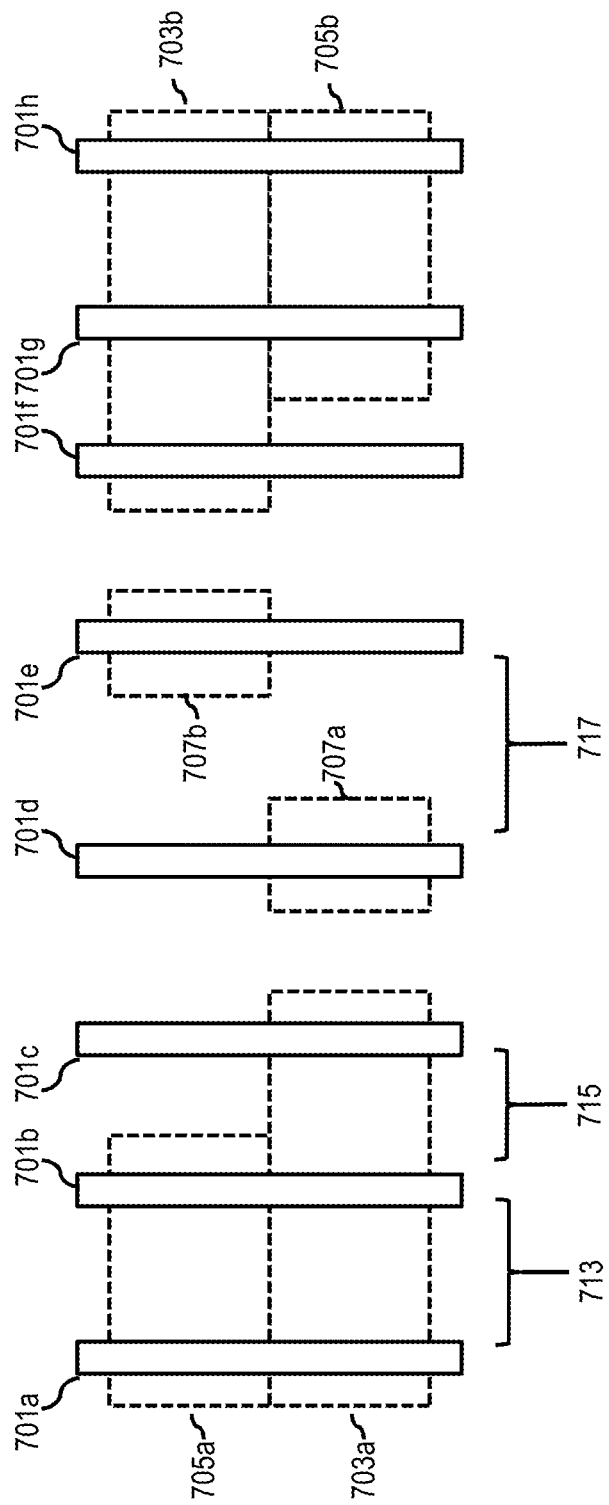

FIG. 7D illustrates an exemplary 1-2-3 SRAM configuration having fins 701a and 701b formed on PD transistor 703a and PG transistor 705a, fin 701c formed on PD transistor 703a, fin 701d formed on PU transistor 707a, fin 701e formed on PU transistor 707b, fin 701f formed on PD transistor 703b, and fins 701g and 701h formed on PD transistor 703b and PG transistor 705b. Additional 1-2-3 SRAM bitcells may be formed on the same substrate (not shown). As illustrated, the exemplary 1-2-3 SRAM has a first distance 713 of 40 nm, a second distance 715 of 30 nm and a third distance 717 of 44 nm. The exemplary 1-2-3 SRAM may be formed using the processes described with respect to FIGS. 1 through 6, for example, with a first mandrel (e.g., 105a) having a width (e.g., 107a) of 60 nm being separated by a distance (e.g., 109) of 126 nm from a second mandrel (e.g., 105b) having a width (e.g., 107b) of 90 nm, a first spacer (e.g., 201) having a width (e.g., 203) of 40 nm, and a second spacer (e.g., 301) having a width of 8 nm.

The embodiments of the present disclosure can achieve several technical effects, including formation of fins having a variable fin pitch less than 40 nm, thereby providing more efficient use of bitcell layout area. The present disclosure enjoys industrial applicability in any of various types of highly integrated semiconductor devices, particularly SRAM bitcells.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
a substrate;
a first fin in the substrate;
a second fin in the substrate being separated from the first fin by a first distance;
a third fin in the substrate being separated from the second fin by a second distance, and being separated from the first fin by the second fin, wherein the first and second distances are different; and
a fourth fin in the substrate separated from the third fin by the first distance, the fourth fin being separated from the second fin by the third fin,
wherein the fins have a variable fin pitch less than 40 nm.

2. The device according to claim 1, wherein the first distance is less than the second distance.

3. The device according to claim 1, comprising:
a fifth fin in the substrate separated from the fourth fin by a third distance, the fifth fin being separated from the third fin by the fourth fin;
a sixth fin in the substrate separated from the fifth fin by the first distance, the sixth fin being separated from the fourth fin by the fifth fin;
a seventh fin in the substrate separated from the sixth fin by the second distance, the seventh fin being separated from the fifth fin by the sixth fin; and
an eighth fin in the substrate separated from the seventh fin by the first distance, the eighth fin being separated from the sixth fin by the seventh fin.

4. The device according to claim 3, wherein the first, second, and third distances are different.

5. The device according to claim 3, comprising:
a first pull-down (PD) transistor, in the substrate, wherein the first fin is formed on the first PD transistor;
a first pass-gate (PG) transistor, in the substrate, wherein the first fin is formed on the first PG transistor;
a first pull-up (PU) transistor, in the substrate, wherein the second fin is formed on the first PU transistor;
a second PU transistor, in the substrate, wherein the third fin is formed on the second PU transistor;
a second PG transistor, in the substrate, wherein the fourth fin is formed on the second PG transistor; and
a second PD transistor, in the substrate, wherein the fourth fin is formed on the second PD transistor.

6. The device according to claim 3, comprising:
a first PD transistor, in the substrate, wherein the first, second, and third fins are formed on the first PD transistor;
a first PG transistor, in the substrate, wherein the first and second fins are formed on the first PG transistor;
a first PU transistor, in the substrate, wherein the fourth fin is formed on the first PU transistor;
a second PU transistor, in the substrate, wherein the fifth fin is formed on the second PU transistor;
a second PG transistor, in the substrate, wherein the seventh and eighth fins are formed on the second PG transistor; and
a second PD transistor, in the substrate, wherein the sixth, seventh, and eighth fins are formed on the second PD transistor.

7. The device according to claim 3, comprising:
a first PD transistor, in the substrate, wherein the first and second fins are formed on the first PD transistor;
a first PG transistor, in the substrate, wherein the first and second fins are formed on the first PG transistor;
a first PU transistor, in the substrate, wherein the third fin is formed on the first PU transistor;
a second PU transistor, in the substrate, wherein the sixth fin is formed on the second PU transistor;
a second PG transistor, in the substrate, wherein the seventh and eighth fins are formed on the second PG transistor; and
a second PD transistor, in the substrate, wherein the seventh and eighth fins are formed on the second PD transistor.

8. The device according to claim 7, wherein the fourth fin is formed on the first PU transistor and the fifth fin is formed on the second PU transistor.

9. A device comprising:
a substrate;
a first fin in the substrate;
a second fin in the substrate being separated from the first fin by a first distance;
a third fin in the substrate being separated from the second fin by a second distance, and being separated from the first fin by the second fin, wherein the first and second distances are different, and the first distance is less than the second distance; and
a fourth fin in the substrate separated from the third fin by the first distance, the fourth fin being separated from the second fin by the third fin,
wherein the fins have a variable fin pitch less than 40 nm.

10. The device according to claim 9, comprising:
a fifth fin in the substrate separated from the fourth fin by a third distance, the fifth fin being separated from the third fin by the fourth fin;
a sixth fin in the substrate separated from the fifth fin by the first distance, the sixth fin being separated from the fourth fin by the fifth fin;
a seventh fin in the substrate separated from the sixth fin by the second distance, the seventh fin being separated from the fifth fin by the sixth fin; and
an eighth fin in the substrate separated from the seventh fin by the first distance, the eighth fin being separated from the sixth fin by the seventh fin.

11. The device according to claim 10, wherein the first, second, and third distances are different.

12. The device according to claim 10, comprising:
a first pull-down (PD) transistor, in the substrate, wherein the first fin is formed on the first PD transistor;
a first pass-gate (PG) transistor, in the substrate, wherein the first fin is formed on the first PG transistor;
a first pull-up (PU) transistor, in the substrate, wherein the second fin is formed on the first PU transistor;
a second PU transistor, in the substrate, wherein the third fin is formed on the second PU transistor;
a second PG transistor, in the substrate, wherein the fourth fin is formed on the second PG transistor; and
a second PD transistor, in the substrate, wherein the fourth fin is formed on the second PD transistor.

13. The device according to claim 10, comprising:
a first PD transistor, in the substrate, wherein the first, second, and third fins are formed on the first PD transistor;
a first PG transistor, in the substrate, wherein the first and second fins are formed on the first PG transistor;
a first PU transistor, in the substrate, wherein the fourth fin is formed on the first PU transistor;
a second PU transistor, in the substrate, wherein the fifth fin is formed on the second PU transistor;
a second PG transistor, in the substrate, wherein the seventh and eighth fins are formed on the second PG transistor; and
a second PD transistor, in the substrate, wherein the sixth, seventh, and eighth fins are formed on the second PD transistor.

14. The device according to claim 10, comprising:
a first PD transistor, in the substrate, wherein the first and second fins are formed on the first PD transistor;
a first PG transistor, in the substrate, wherein the first and second fins are formed on the first PG transistor;
a first PU transistor, in the substrate, wherein the third fin is formed on the first PU transistor;
a second PU transistor, in the substrate, wherein the sixth fin is formed on the second PU transistor;
a second PG transistor, in the substrate, wherein the seventh and eighth fins are formed on the second PG transistor; and
a second PD transistor, in the substrate, wherein the seventh and eighth fins are formed on the second PD transistor.

15. The device according to claim 14, wherein the fourth fin is formed on the first PU transistor and the fifth fin is formed on the second PU transistor.

16. A device comprising:
a substrate;
a first fin in the substrate;
a second fin in the substrate being separated from the first fin by a first distance;
a third fin in the substrate being separated from the second fin by a second distance, and being separated from the first fin by the second fin, wherein the first and second distances are different;
a fourth fin in the substrate separated from the third fin by the first distance, the fourth fin being separated from the second fin by the third fin;
a fifth fin in the substrate separated from the fourth fin by a third distance, the fifth fin being separated from the third fin by the fourth fin;
a sixth fin in the substrate separated from the fifth fin by the first distance, the sixth fin being separated from the fourth fin by the fifth fin;
a seventh fin in the substrate separated from the sixth fin by the second distance, the seventh fin being separated from the fifth fin by the sixth fin; and
an eighth fin in the substrate separated from the seventh fin by the first distance, the eighth fin being separated from the sixth fin by the seventh fin,
wherein the fins have a variable fin pitch less than 40 nm.

17. The device according to claim 16, comprising:
a first pull-down (PD) transistor, in the substrate, wherein the first fin is formed on the first PD transistor;
a first pass-gate (PG) transistor, in the substrate, wherein the first fin is formed on the first PG transistor;
a first pull-up (PU) transistor, in the substrate, wherein the second fin is formed on the first PU transistor;
a second PU transistor, in the substrate, wherein the third fin is formed on the second PU transistor;
a second PG transistor, in the substrate, wherein the fourth fin is formed on the second PG transistor; and
a second PD transistor, in the substrate, wherein the fourth fin is formed on the second PD transistor.

* * * * *